(12) United States Patent
Cha et al.

(10) Patent No.: US 12,336,182 B2
(45) Date of Patent: Jun. 17, 2025

(54) SEMICONDUCTOR DEVICE HAVING 3D STACKED STRUCTURE AND METHOD OF MANUFACTURING THE SAME

(71) Applicants: Samsung Electronics Co., Ltd., Suwon-si (KR); KOREA ADVANCED INSTITUTE OF SCIENCE AND TECHNOLOGY, Daejeon (KR)

(72) Inventors: Youngkwan Cha, Hwaseong-si (KR); Jaechul Park, Yongin-si (KR); Sanghun Jeon, Seoul (KR)

(73) Assignees: Samsung Electronics Co., Ltd., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 652 days.

(21) Appl. No.: 17/688,043

(22) Filed: Mar. 7, 2022

(65) Prior Publication Data
US 2022/0285401 A1    Sep. 8, 2022

(30) Foreign Application Priority Data
Mar. 8, 2021    (KR) .......................... 10-2021-0030414

(51) Int. Cl.
*H10B 51/20* (2023.01)
*H10B 51/10* (2023.01)

(52) U.S. Cl.
CPC ............ *H10B 51/20* (2023.02); *H10B 51/10* (2023.02)

(58) Field of Classification Search
CPC .............................. H10B 51/20; H10B 51/10
USPC ........................................................ 257/295
See application file for complete search history.

(56) References Cited

U.S. PATENT DOCUMENTS

| 7,226,795 B2 | 6/2007 | Sakai |
| 9,263,577 B2 | 2/2016 | Ramaswamy et al. |
| 9,818,848 B2 | 11/2017 | Sun et al. |
| 10,192,972 B2 | 1/2019 | Sakai et al. |
| 10,374,086 B2 | 8/2019 | Hu |
| 2017/0053906 A1* | 2/2017 | Or-Bach ............... H10B 12/20 |

(Continued)

FOREIGN PATENT DOCUMENTS

| JP | 4887481 B2 | 2/2012 |
| KR | 101771170 B1 | 8/2017 |
| WO | WO-2018/144957 A1 | 8/2018 |

OTHER PUBLICATIONS

Extended European Search Report dated Jul. 7, 2022, issued in corresponding European Patent Application No. 22150448.3.

*Primary Examiner* — Igwe U Anya
(74) *Attorney, Agent, or Firm* — HARNESS, DICKEY & PIERCE, P.L.C.

(57) ABSTRACT

Provided are semiconductor devices having a three-dimensional stacked structure and methods of manufacturing the same. A semiconductor device includes a plurality of channel structures on a substrate and arranged in a three-dimensional array; a plurality of gate electrodes extending in a direction parallel to the substrate; and a plurality of source and drain electrodes extending in a direction perpendicular to the substrate. The gate electrodes are connected to the channel structures arranged in the direction parallel to the substrate, and the source and drain electrodes are connected to the channel structures arranged in the direction perpendicular to the substrate. The channel structures include a channel layer and a ferroelectric layer on the channel layer.

21 Claims, 15 Drawing Sheets

(56) References Cited

U.S. PATENT DOCUMENTS

| | | |
|---|---|---|
| 2018/0366489 A1 | 12/2018 | Harari et al. |
| 2020/0013791 A1* | 1/2020 | Or-Bach ................ H10B 43/20 |
| 2022/0005821 A1* | 1/2022 | Or-Bach ................ H10B 43/27 |
| 2022/0005830 A1* | 1/2022 | Wu ..................... H01L 29/6684 |

* cited by examiner

SEMICONDUCTOR DEVICE HAVING 3D STACKED STRUCTURE AND METHOD OF MANUFACTURING THE SAME

CROSS-REFERENCE TO RELATED APPLICATION

This application is based on and claims priority under 35 U.S.C. § 119 to Korean Patent Application No. 10-2021-0030414, filed on Mar. 8, 2021, in the Korean Intellectual Property Office, the disclosure of which is incorporated by reference herein in its entirety.

BACKGROUND

1. Field

The present disclosure relates to a semiconductor device having a three-dimensional stacked structure and a method of manufacturing the same.

2. Description of the Related Art

Dynamic random access memory (DRAM) is a memory device that has a structure in which a transistor serving as a switch is connected to a capacitor capable of storing charges, and distinguishes "0" and "1" by an amount of charges stored in the capacitor. As such, DRAM requires additional capacitors to store over certain amount of charges, there is a limit in reducing a size of a memory device, and accordingly, it is not easy to increase the density of a memory device.

SUMMARY

Provided are semiconductor devices having a three-dimensional stacked structure and/or methods of manufacturing the same.

Additional aspects will be set forth in part in the description which follows and, in part, will be apparent from the description, or may be learned by practice of the presented embodiments of the disclosure.

According to an embodiment, a semiconductor device includes a substrate, a plurality of channel structures on the substrate, a plurality of gate electrodes extending in a direction parallel to the substrate, and a plurality of source electrodes and drain electrodes extending in a direction perpendicular to the substrate. The plurality of channel structure are arranged in a three-dimensional array including channel structures arranged in the direction parallel to the substrate and channel structures arranged in the direction perpendicular to the substrate. The gate electrodes are connected to the channel structures that are arranged in the direction parallel to the substrate. The source electrodes and the drain electrodes are connected to the channel structures that are arranged in the direction perpendicular to the substrate. The plurality of channel structures each include a channel layer and a ferroelectric layer on the channel layer.

In some embodiments, the ferroelectric layer and the channel layer in each corresponding channel structure among the plurality of channel structures may provide ferroelectric layers arranged in the direction parallel to the substrate and channel layers arranged in the direction perpendicular to the substrate. The gate electrodes may be connected to the ferroelectric layers arranged in a direction parallel to the substrate, and the source electrodes and the drain electrodes may be connected to the channel layers arranged in a direction perpendicular to the substrate.

In some embodiments, the ferroelectric layer may include fluorite-based materials or perovskite.

In some embodiments, the ferroelectric layer may include an oxide of at least one of Hf and Zr. The ferroelectric layer may further include a dopant of at least one of Si, Al, La, Y, Sr, and Gd.

In some embodiments, the plurality of channel structures each may further include a gate insulation layer between the channel layer and the ferroelectric layer.

In some embodiments, the plurality of channel structures each may further include a floating electrode between the ferroelectric layer and the gate insulation layer.

In some embodiments, the semiconductor device may have properties of a non-volatile memory.

According to an embodiment, a method of manufacturing a semiconductor device includes alternately stacking a plurality of insulation layers and a plurality of channel layers on a substrate, forming a plurality of cell blocks by etching the plurality of insulation layers and the plurality of channel layers in a direction perpendicular to the substrate, forming a plurality of channel recesses by selectively etching the plurality of channel layers between the plurality of insulation layers, forming a ferroelectric layer and a gate electrode on each channel layer in each channel recess among the plurality of channel layers and the plurality of channel recesses, separating each cell block among the plurality of cell blocks by etching the plurality of insulation layers and the plurality of channel layers in a direction perpendicular to the substrate, and forming a source electrode and a drain electrode on the substrate. The source electrode and the drain electrode extend in a direction perpendicular to the substrate.

In some embodiments, the forming the gate electrode may include forming electrically conductive materials in spaces between the plurality of cell blocks, and etching the electrically conductive materials so a remaining portion of the electrically conductive materials remains only in the plurality of channel recesses.

In some embodiments, the forming the ferroelectric layer may form a plurality of ferroelectric layers arranged in a direction parallel to the substrate. The gate electrode may be formed to be connected to the plurality of ferroelectric layers arranged in the direction parallel to the substrate.

In some embodiments, the forming the source electrode and the drain electrode may include forming a through hole in the plurality of insulation layers and the plurality of channel layers by etching the plurality of insulation layers and the plurality of channel layers in the direction perpendicular to the substrate, and filling the through hole with the electrically conductive materials.

In some embodiments, the source electrode and drain electrode may be formed to be connected to the plurality of channel layers arranged in a direction perpendicular to the substrate.

In some embodiments, the ferroelectric layer may include fluorite-based materials or perovskite.

In some embodiments, the ferroelectric layer may include an oxide of at least one of Hf and Zr. The ferroelectric layer may further include a dopant of at least one of Si, Al, La, Y, Sr, and Gd.

In some embodiments, the method may further include forming a gate insulation layer between the channel layer and the ferroelectric layer.

In some embodiments, the method may further include forming a floating electrode between the ferroelectric layer and the gate insulation layer.

According to an embodiment, a semiconductor device includes a substrate and a cell plate on an upper surface of the substrate. The cell plate includes a plurality of insulation layers and a plurality of cell layers alternately stacked on the upper surface of the substrate. Each of the plurality of cell layers include a gate electrode extending in a first direction and a plurality of channel structures. The plurality of channel structures are spaced apart from each other in the first direction and connected to the gate electrode. Each of the plurality of channel structures include a channel layer and a ferroelectric layer between the gate electrode and the channel layer. The cell plate includes a plurality of source electrodes and a plurality of drain electrodes on the upper surface of the substrate and alternately arranged and spaced apart from each other in the first direction. The plurality of source electrodes and the plurality of drain electrodes extend in a direction perpendicular to the upper surface of the substrate through the plurality of insulation layers and the plurality of cell layers alternately stacked. Each channel layer, in the plurality of channel structures of each of the plurality of cell layers, has a corresponding one of the plurality of source electrodes and a corresponding one of the plurality of drain electrodes extending therethrough.

In some embodiments, the ferroelectric layer may include an oxide of at least one of Hf and Zr.

In some embodiments, an insulation layer may be on the substrate. The cell plate may be a first cell plate among a plurality of cell plates on the substrate. The plurality of cell plates may include a second cell plate, The insulation layer may extend in the direction perpendicular to the upper surface of the substrate and may be between the first cell plate and the second cell plate.

In some embodiments, each of the plurality of channel structures may include a gate insulation layer between the ferroelectric layer and the channel layer.

In some embodiments, each of the plurality of channel structures may include a floating electrode between the ferroelectric layer and the gate insulation layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
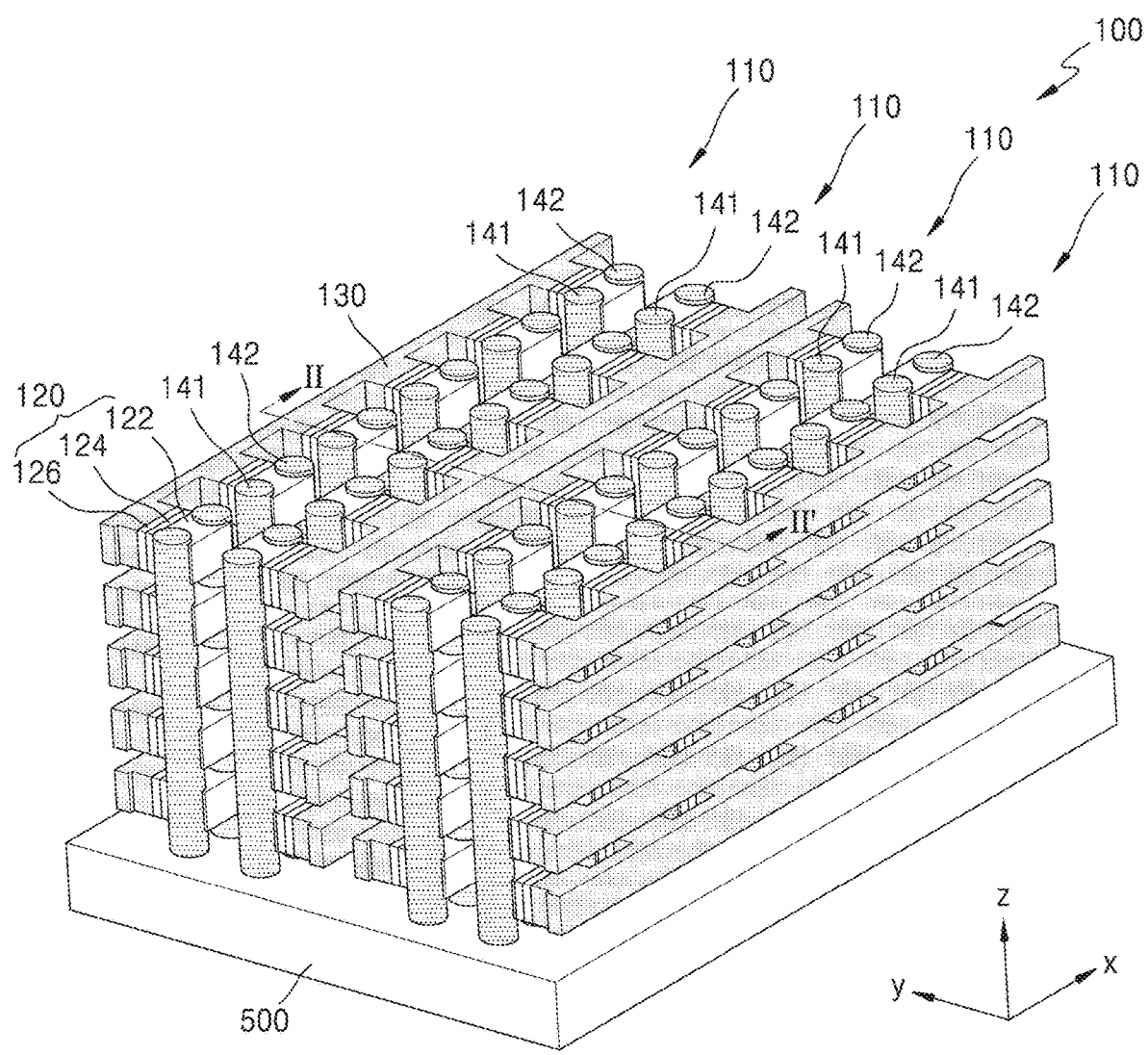
FIG. 1 is a perspective view of a semiconductor device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

Hereinafter, example embodiments will be described in detail with reference to the accompanying drawings. In the drawings, like reference numerals demote like elements, and sizes of each components are exaggerated for clarity and convenience in explanation. Meanwhile, embodiments described below are provided only as an example, and thus can be embodied in various forms.

It will be understood that when a component is referred to as being "on" or "over" another component, the component can be directly on, under, on the left of, or on the right of the other component, or can be on, under, on the left of, or on the right of the other component in a non-contact manner. An expression used in the singular encompasses the expression of the plural, unless it has a clearly different meaning in the context. Further, when a portion "includes" an element, another element may be further included, rather than excluding the existence of other elements, unless otherwise described.

The use of the terms "a" and "an" and "the" and similar referents in the context of describing embodiments are to be construed to cover both the singular and the plural. The operations of all methods described herein can be performed in any suitable order unless otherwise indicated herein or otherwise clearly contradicted by context, and embodiments are not limited to the described order of the operations.

In addition, the terms "part," "module," etc. described herein mean a unit for processing at least one function or operation, and can be implemented as a hardware or a software, or as a combination of a hardware and a software.

The connecting lines, or connectors shown in the various figures presented are intended to represent example functional relationships and/or physical or logical couplings between the various elements, and thus it should be noted that many alternative or additional functional relationships, physical connections or logical connections may be present in a practical device.

The use of any and all examples, or example language provided herein, is intended merely to better illuminate technical ideas and does not pose a limitation on the scope of embodiments unless otherwise claimed.

The semiconductor device described in the following embodiments may include, for example, a non-volatile memory device having a one-transistor (1T) structure, more specifically, a ferroelectric field effect transistor (FeFET) memory device.

Figure 2:
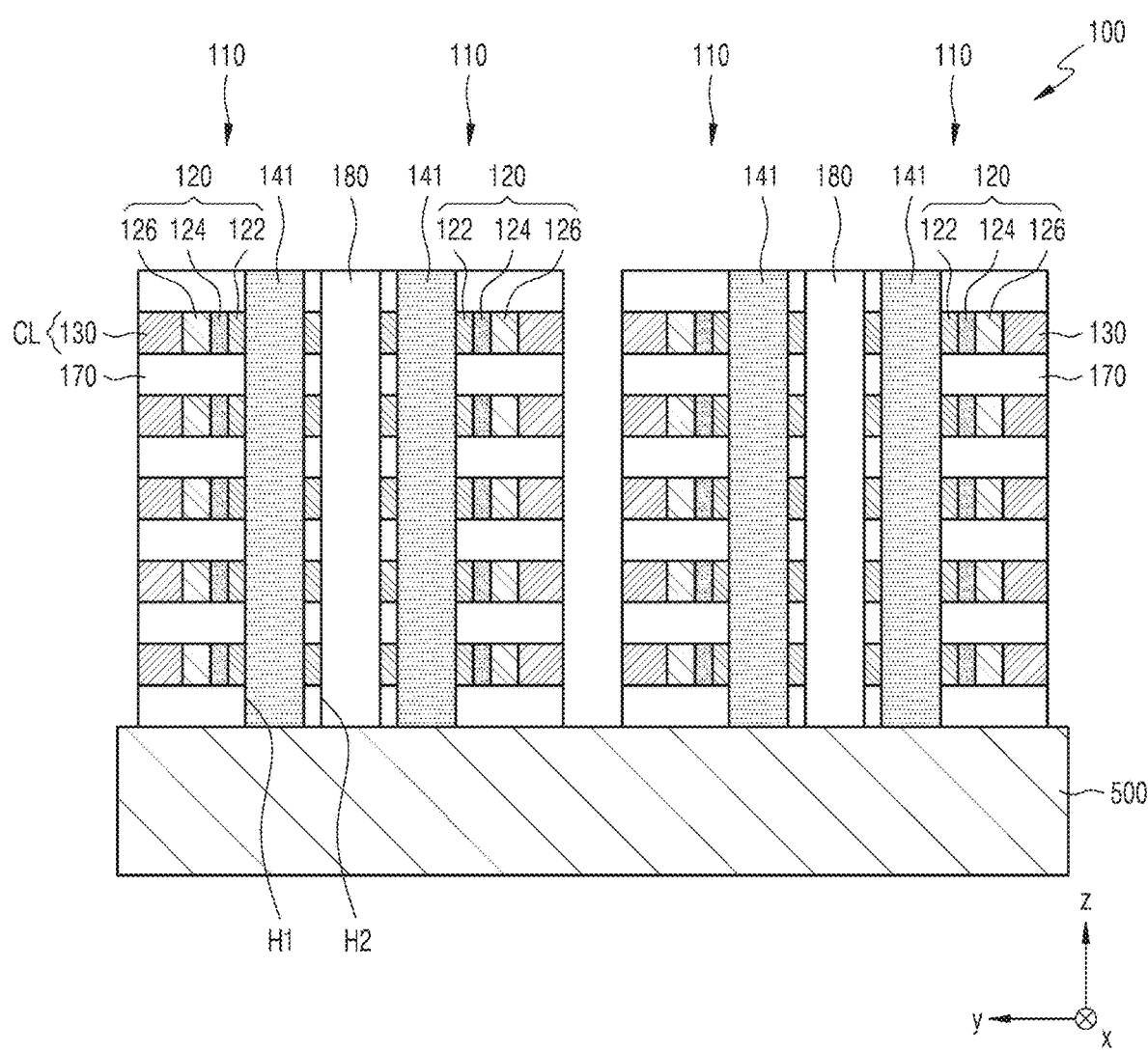
FIG. 2 is a cross-sectional diagram of the semiconductor device of FIG. 1, taken along the line II-II' in FIG. 1.

FIG. 1 is a perspective view of a semiconductor device according to an example embodiment. FIG. 2 is a cross-sectional diagram of the semiconductor device of FIG. 1, taken along the line II-II' in FIG. 1.

With reference to FIGS. 1 and 2, a plurality of cell plates 110 may be arranged on a substrate 500 in the z-axis direction perpendicular to the substrate 500 (e.g., a direction parallel to the xz plane). Here, the plurality of cell plates 100 may be arranged side by side. Each cell plate 110 may include a plurality of channel structures 120, a plurality of gate electrodes 130, and a plurality of source electrodes 141 and drain electrodes 142. A first insulation layer 170 and a second insulation layer 180 may be formed between the channel structures 120. The first insulation layer 170 may be provided for insulation between the channel structures 120 on each cell plate 110, and the second insulation layer 180 may be provided for insulation between adjacent cell plates 110. Meanwhile, the first and second insulation layers 170 and 180 are not shown in FIG. 1 for convenience. The gate electrode 130 and channel structure 120 at a same height in a cell plate 110 may be referred to as a cell layer CL (see FIG. 2). The source electrode 141 and drain electrode 142 may extend in the z-axis direction through first holes H1 defined in the cell plate 110. The second insulation layer 180 may extend in the z-direction through second holes H2 defined between two cell plates 110 that are adjacent to each other.

Each channel structure 120 may include a channel layer 122, a gate insulation layer 124, and a ferroelectric layer 126. Here, the gate insulation layer 124 and the ferroelectric layer 126 may be stacked on the channel layer 122 in this stated order in the y-axis direction parallel to the substrate 500.

Each gate electrode 130 may be provided to extend in the x-axis direction parallel to the substrate 500. The gate electrode 130 may be connected to the channel structures 120 (specifically, the ferroelectric layers 126) arranged in the x-axis direction parallel to the substrate 500. In addition, each source electrode 141 and drain electrode 142 may be provided to extend in the z-axis direction perpendicular to the substrate 500. The source electrode 141 and the drain electrode 142 may be connected to channel structures 120 (specifically, the channel layers 122) arranged in the z-axis direction perpendicular to the substrate 500. The source electrode 141 and the drain electrode 142 may be provided on both sides of each channel layer 122.

Figure 3:
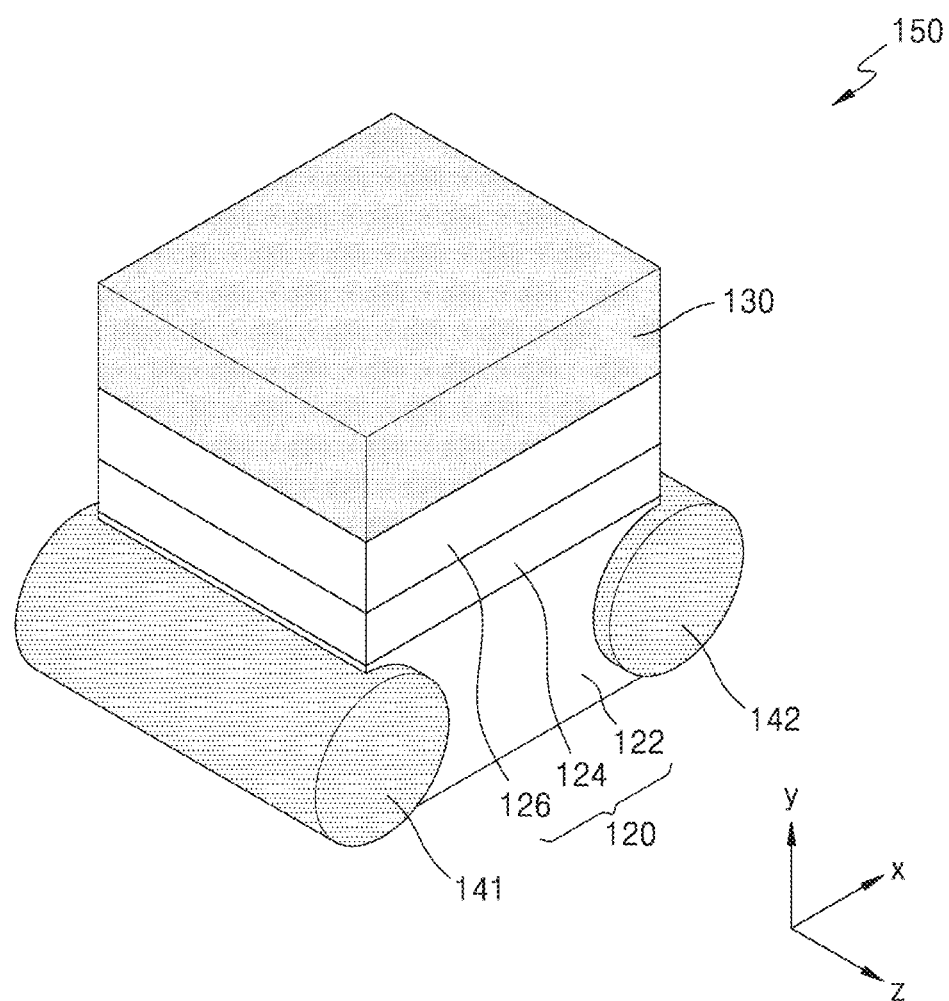
FIG. 3 is a diagram of a ferroelectric field effect transistor (FeFET), which is a unit element of the semiconductor device of FIG. 1.
Figure 4:
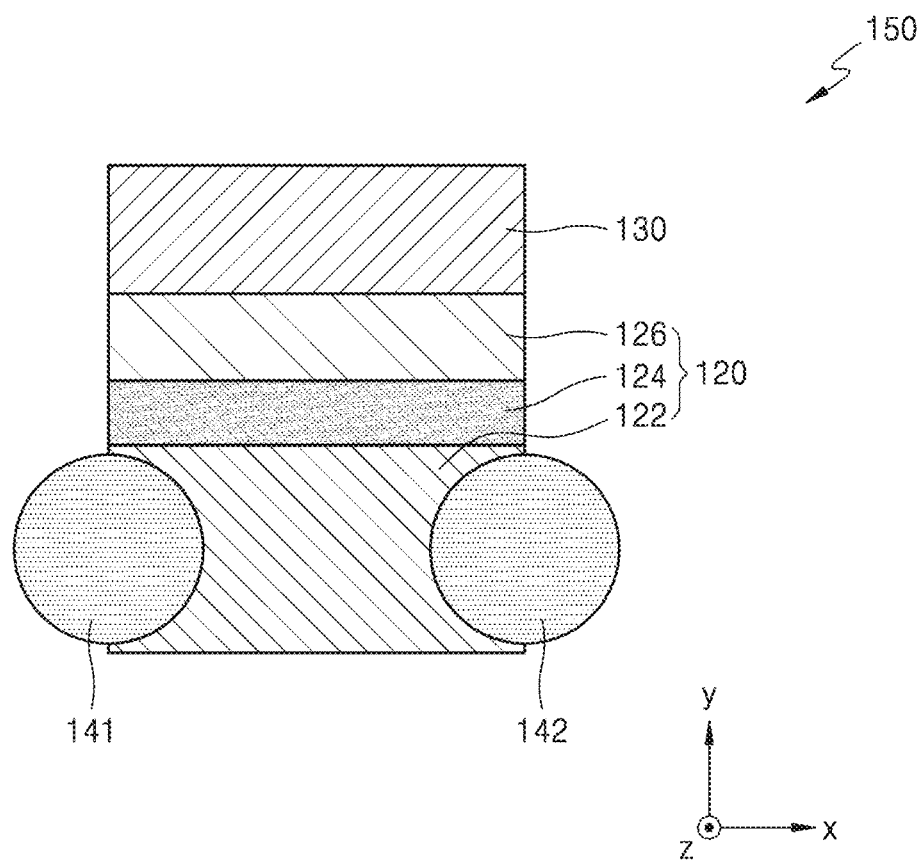
FIG. 4 is a cross-sectional view of FIG. 3.

FIG. 3 is a diagram of a ferroelectric field effect transistor (FeFET), which is a unit element of the semiconductor device of FIG. 1. FIG. 4 is a cross-sectional view of FIG. 3.

With reference to FIGS. 3 and 4, a ferroelectric field effect transistor (FeFET) 150 may include the channel structure 120, the gate electrode 130, the source electrode 141 and the drain electrode 142. Here, the channel structure 120 may include the channel layer 122, the gate insulation layer 124, and the ferroelectric layer 126. This FeFET may have a metal-ferroelectric-insulator-semiconductor (MFIS) structure.

The channel layer 122 may include, for example, Si, Ge, SiGe, or group III-V semiconductors, etc. Further, the channel layer 122 may include, for example, an oxide semiconductor, a nitride semiconductor, an oxynitride semiconductor, a two-dimensional (2D) material, quantum dots, an organic semiconductor, etc. The oxide semiconductor may include, for example, InGaZnO, etc., and the 2D material may include, for example, transition metal dichalcogenide (TMD) or graphene, and the quantum dots may include colloidal quantum dots (QDs), a nanocrystal structure, etc. However, the foregoing is provided only as an example, and the channel layer 122 may also include a variety of different semiconductor materials.

The gate insulation layer 124 may be provided on the channel layer 122. The gate insulation layer 124 may include paraelectric materials or high-k materials. For example, the gate insulation layer 124 may include a silicon oxide, a silicon nitride, an aluminum oxide, a hafnium oxide, a zirconium oxide, etc. or a 2D insulator such as a hexagonal boron nitride (h-BN). However, the foregoing is provided only as an example.

The ferroelectric layer 126 may be provided on the gate insulation layer 124. Ferroelectrics refer to materials having a spontaneous electric dipole even in the absence of an external electric field, e.g., having spontaneous polarization. The polarization direction of such ferroelectrics may be switched per the domain unit by an external electric field.

The ferroelectric layer 126 may include, for example, perovskite or fluorite-based materials. Perovskite may include, for example, PZT, $BaTiO_3$, $PbTiO_3$, etc. Fluorite-based materials may include, for example, at least one oxide selected from Hf, Si, Al, Zr, Y, La, Gd, and Sr.

For example, the ferroelectric layer 126 may include an oxide of at least one of Hf and Zr. In such a case, the ferroelectric layer 126 may further include a dopant of at least one of Si, Al, La, Y, Sr, and Gd. However, the materials mentioned above are provided only as an example, and other various materials may be used as the ferroelectric layer 126.

The gate electrode 130 may be provided on the ferroelectric layer 126. Here, the gate electrode 130 may be provided to be connected to the ferroelectric layers 126 arranged in a direction parallel to the substrate 500 (specifically, the x-axis direction) in the semiconductor device 100. The gate electrode 130 may include electrically conductive materials. For example, the gate electrode 130 may include electrically conductive metals, such as gold, silver, aluminum, etc., electrically conductive metal oxides or electrically conductive metal nitrides. The source electrode 141 and the drain electrode 142 may be provided on each side of the channel layer 122. The source electrode 141 and the drain electrode 142 may include electrically conductive materials as in the gate electrode 130.

With reference to FIGS. 1 and 2, the semiconductor device 100 may have a structure in which a plurality of unit elements (e.g., ferroelectric field effect transistors: FeFETs 150) are stacked on the substrate 500 in the form of a three-dimensional array. Specifically, the semiconductor device 100 may include a plurality of channel structures 120 arranged on the substrate 500 in the form of a three-dimensional array, and a plurality of gate electrodes 130 extending in the x-axis direction parallel to the substrate 500, and a plurality of source electrodes 141 and drain electrodes 142 extending in the z-axis direction perpendicular to the substrate 500. Here, each gate electrode 130 may be connected to contact the channel structures 120 (specifically, the ferroelectric layers 126) arranged in the x-axis direction parallel to the substrate 500. Further, each source electrode 141 and drain electrode 142 may be connected to contact the channel structures 120 (specifically, the channel layers 122) arranged in the z-axis direction perpendicular to the substrate 500.

According to the foregoing example embodiment, as the semiconductor device 100 includes a plurality of FeFETs 150 stacked in the form of a three-dimensional array, a memory device having a one-transistor (1T) structure with a high memory density may be implemented. The semiconductor device 100 may be used, for example, as a non-volatile memory device.

Hereinafter, a method of manufacturing a semiconductor device according to an example embodiment will be described. FIGS. 5 to 12 are diagrams for explaining a method of manufacturing a semiconductor device according to an example embodiment.

Figure 5:
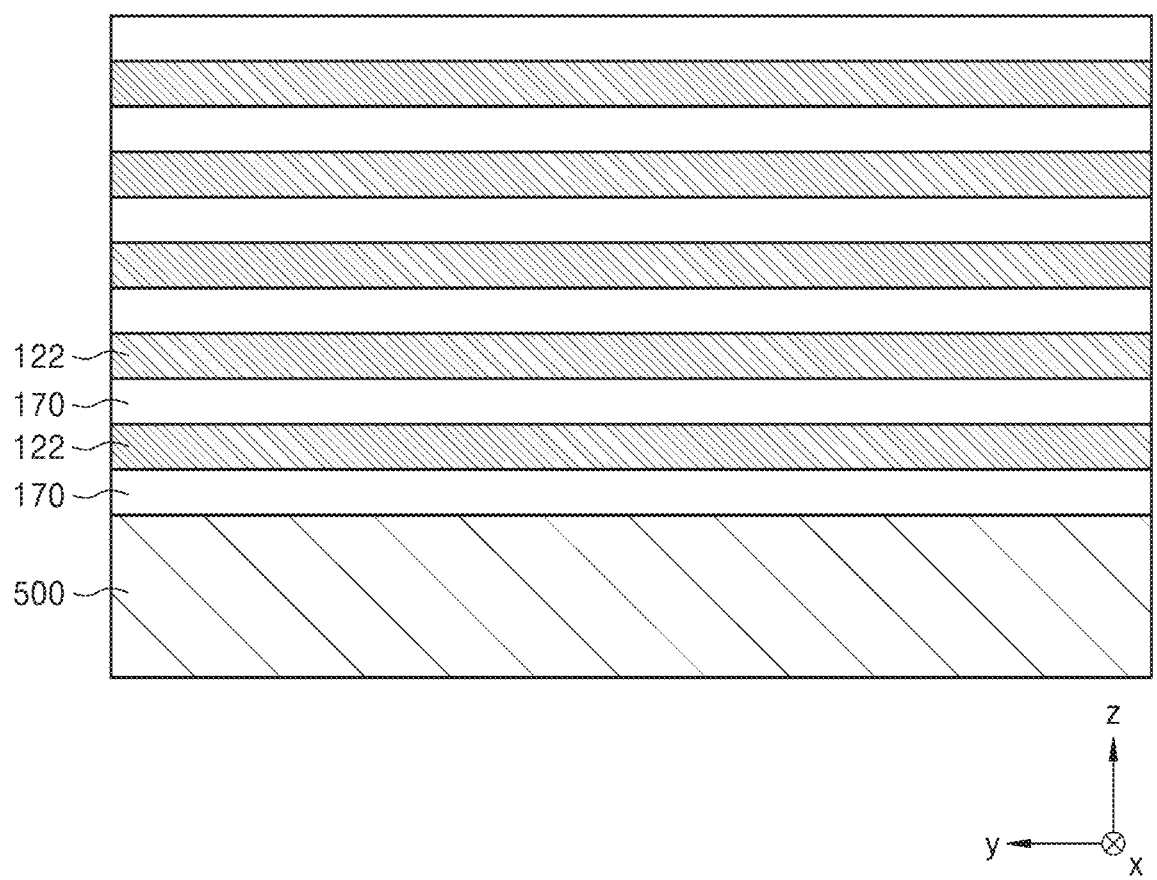
FIGS. 5 to 12 are diagrams for explaining a method of manufacturing a semiconductor device according to an example embodiment.

With reference to FIG. 5, after the substrate 500 is prepared, the plurality of first insulation layers 170 and the plurality of channel layers 122 are stacked on the substrate 500 by turns. Here, the first insulation layer 170 may include, but is not limited to, for example, a silicon oxide, etc.

The channel layer 122 may include, for example, Si, Ge, SiGe, or group III-V semiconductors, etc. Further, the channel layer 122 may include, for example, an oxide semiconductor, a nitride semiconductor, an oxynitride semiconductor, a two-dimensional (2D) material, quantum dots, an organic semiconductor, etc. The oxide semiconductor may include, for example, InGaZnO, etc., and the 2D material may include, for example, TMD or graphene, and the quantum dots may include a colloidal QDs, a nanocrystal structure, etc. However, the foregoing is provided only as an example, and the channel layer 122 may also include a variety of different semiconductor materials.

Figure 6:
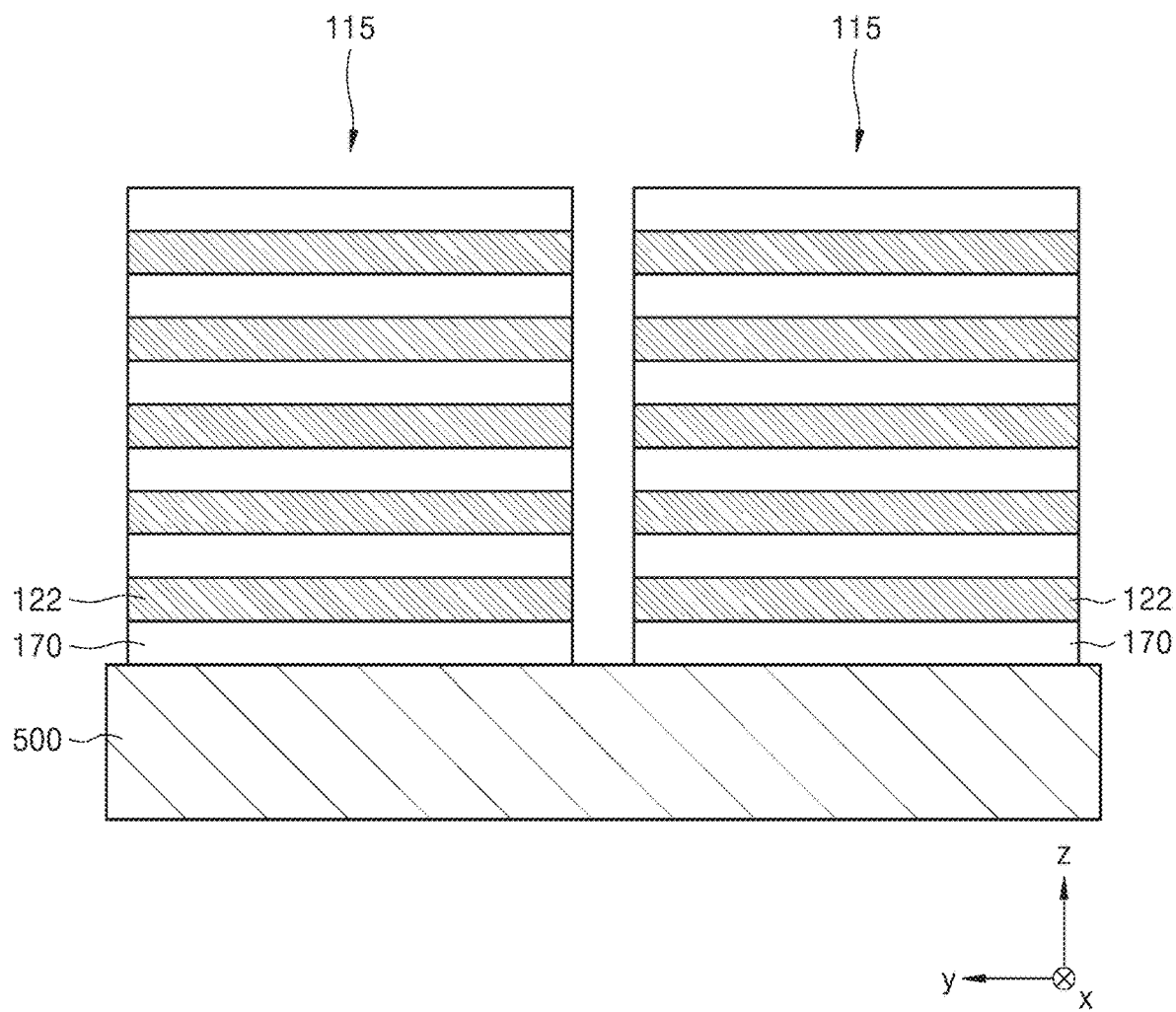

With reference to FIG. 6, a plurality of cell blocks 115 may be formed by etching a plurality of first insulation layers 170 and a plurality of channel layers 122 in the z-axis direction perpendicular to the substrate 500 in the structure illustrated in FIG. 5.

Figure 7:
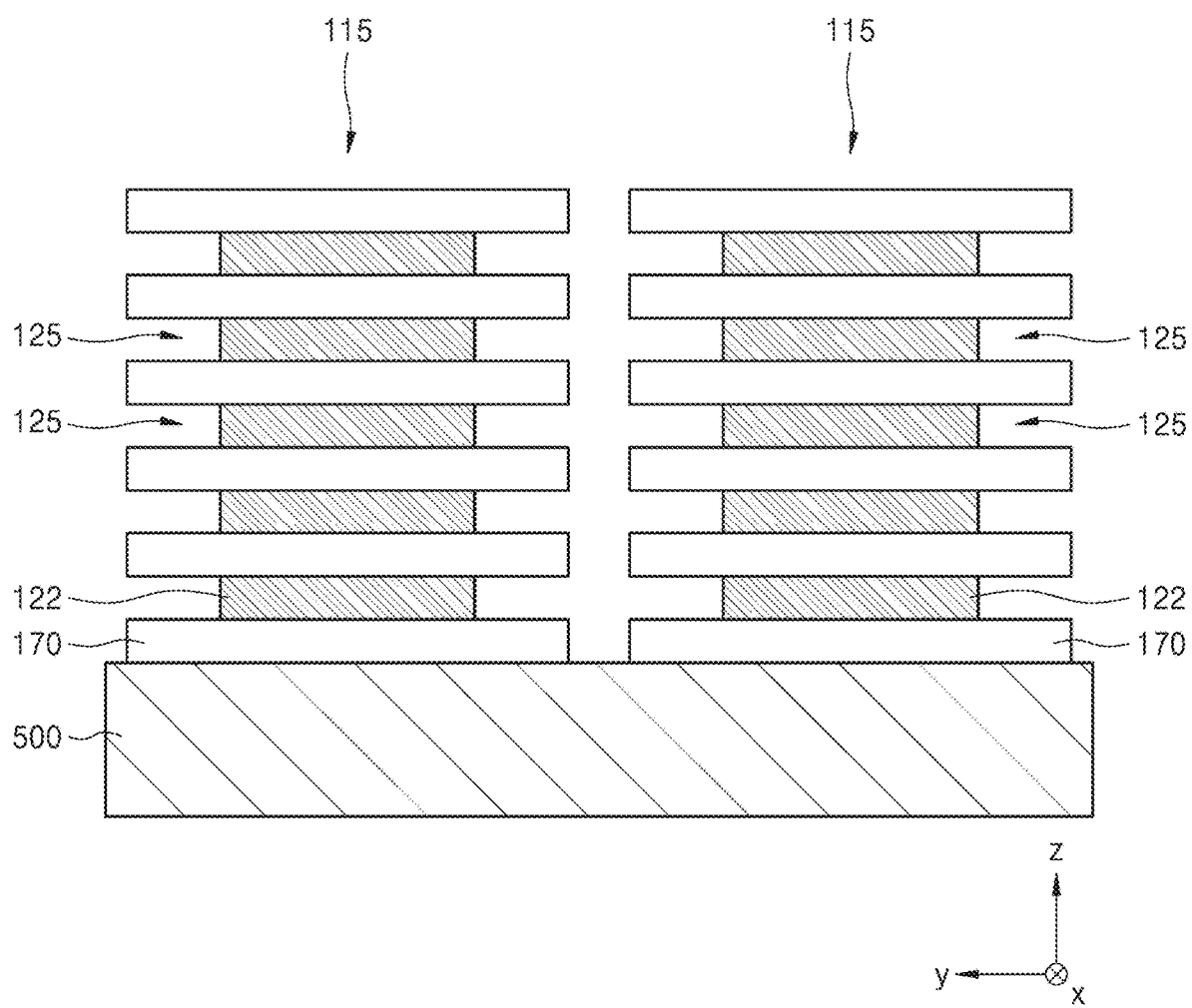

With reference to FIG. 7, a plurality of channel layers 122 exposed between a plurality of first insulation layers 170 may be selectively etched in each cell block 115. Here, as the plurality of channel layers 122 are selectively etched in the y-axis direction parallel to substrate 500, channel recesses 125 may be formed between the plurality of first insulation layers 170. Here, each channel recess 125 may be formed to extend in the x-axis direction parallel to the substrate 500.

Figure 8:
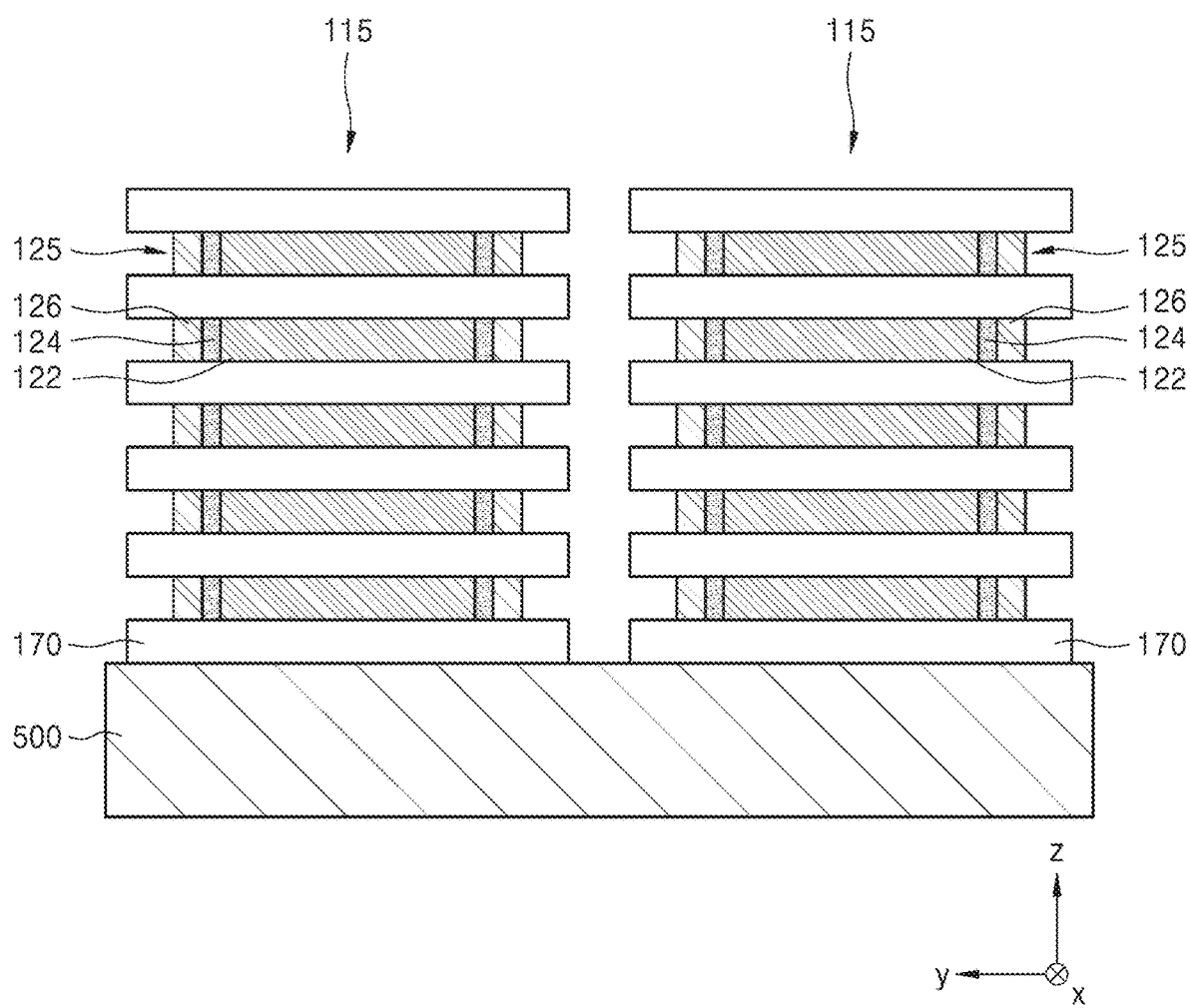

With reference to FIG. 8, in each channel recess 125, the gate insulation layer 124 and the ferroelectric layer 126 may be stacked on the channel layer 122 in this stated order. Specifically, the gate insulation layer 124 and the ferroelectric layer 126 may be stacked on a side of the channel layer 122 in the y-axis direction parallel to the substrate 500.

The gate insulation layer 124 may include paraelectric materials or high-k materials. For example, the gate insulation layer 124 may include a silicon oxide, a silicon nitride, an aluminum oxide, a hafnium oxide, a zirconium oxide, etc. or a 2D insulator such as a hexagonal boron nitride (h-BN). However, the foregoing is provided only as an example.

The ferroelectric layer 126 may include, for example, perovskite or fluorite-based materials. Perovskite may include, for example, PZT, $BaTiO_3$, $PbTiO_3$, etc. Fluorite-based materials may include, for example, an oxide of at least one selected from Hf, Si, Al, Zr, Y, La, Gd, and Sr. For example, the ferroelectric layer 126 may include an oxide of at least one of Hf and Zr. In such a case, the ferroelectric layer 126 may further include a dopant of at least one of Si, Al, La, Y, Sr, and Gd. However, the materials mentioned above are provided only as an example, and other various materials may be used as the ferroelectric layer 126.

Figure 9:
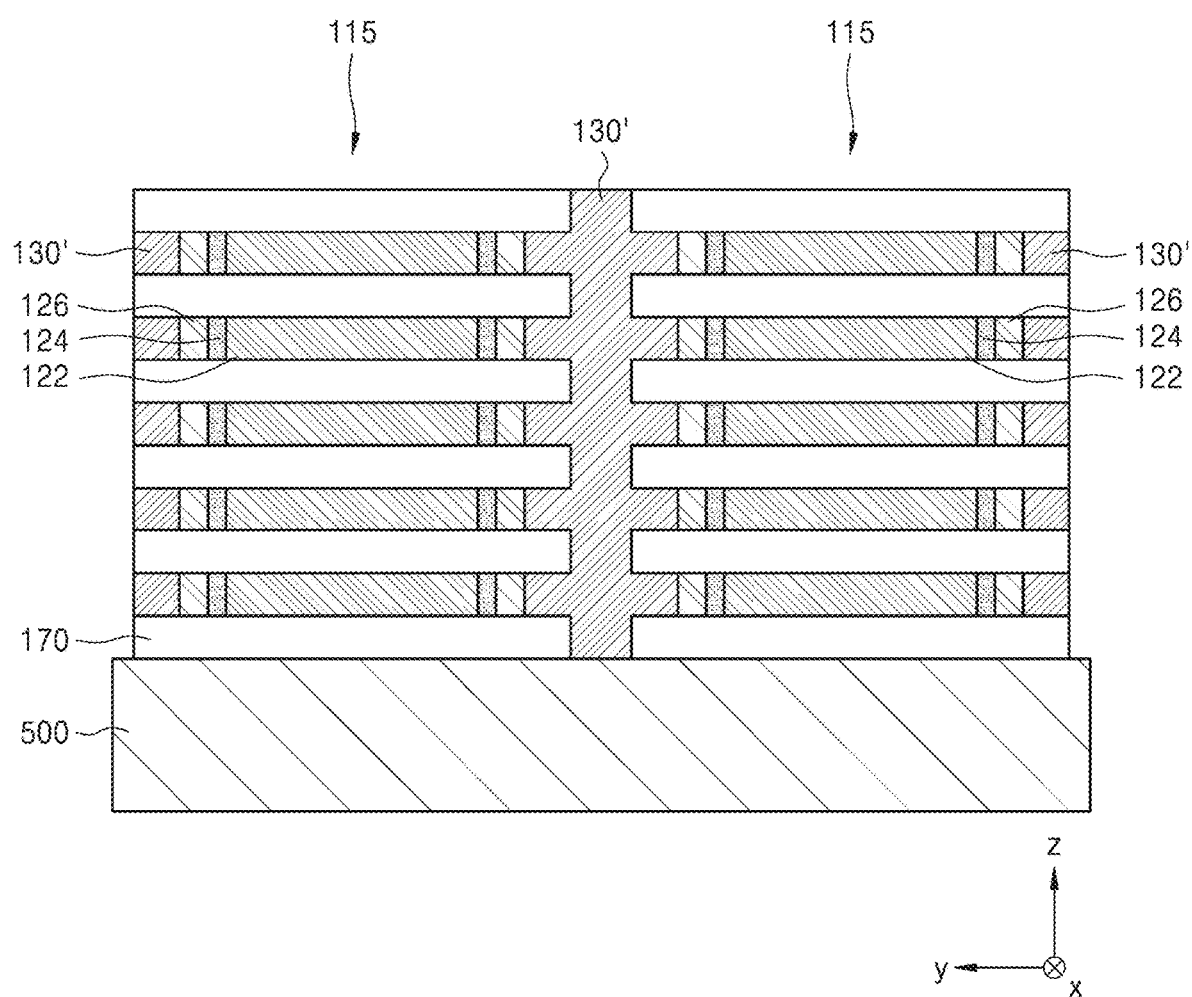

With reference to FIG. 9, internal spaces of the channel recesses 125 and spaces between the cell blocks 115 may be filled with an electrically conductive material 130'. Here, the electrically conductive material 130' may be a material forming the gate electrode 130, and include, for example, an electrically conductive metal, an electrically conductive metal oxide or an electrically conductive metal nitride, etc.

Figure 10:
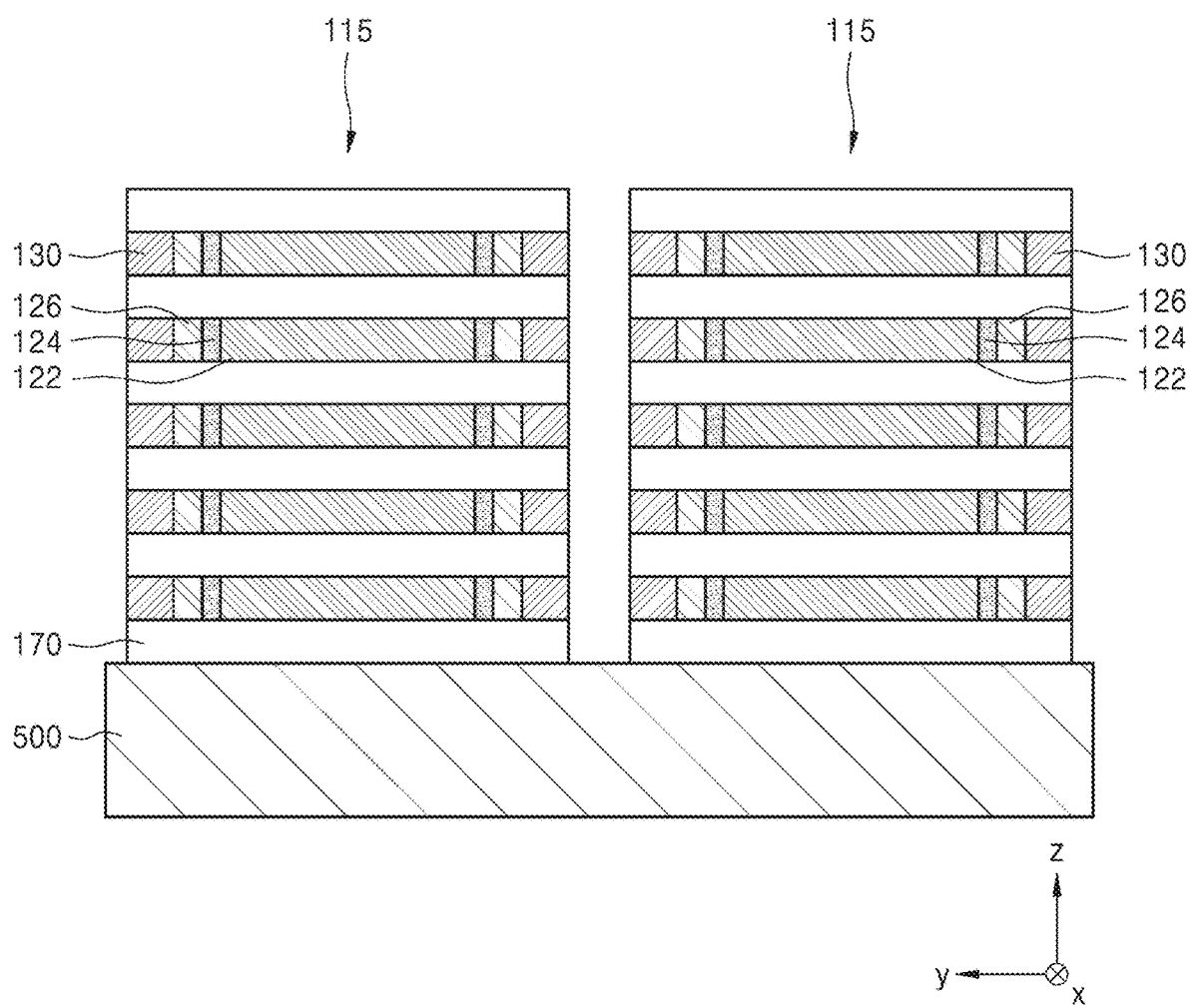

Next, with reference to FIG. 10, a plurality of gate electrodes 130 may be formed by etching the electrically conductive material 130' in the z-axis direction perpendicular to the substrate 500, allowing only the electrically conductive material 130' to be left in the channel recesses 125. Here, each gate electrode 130 may be formed to extend in the x-axis direction parallel to the substrate 500.

Figure 11:
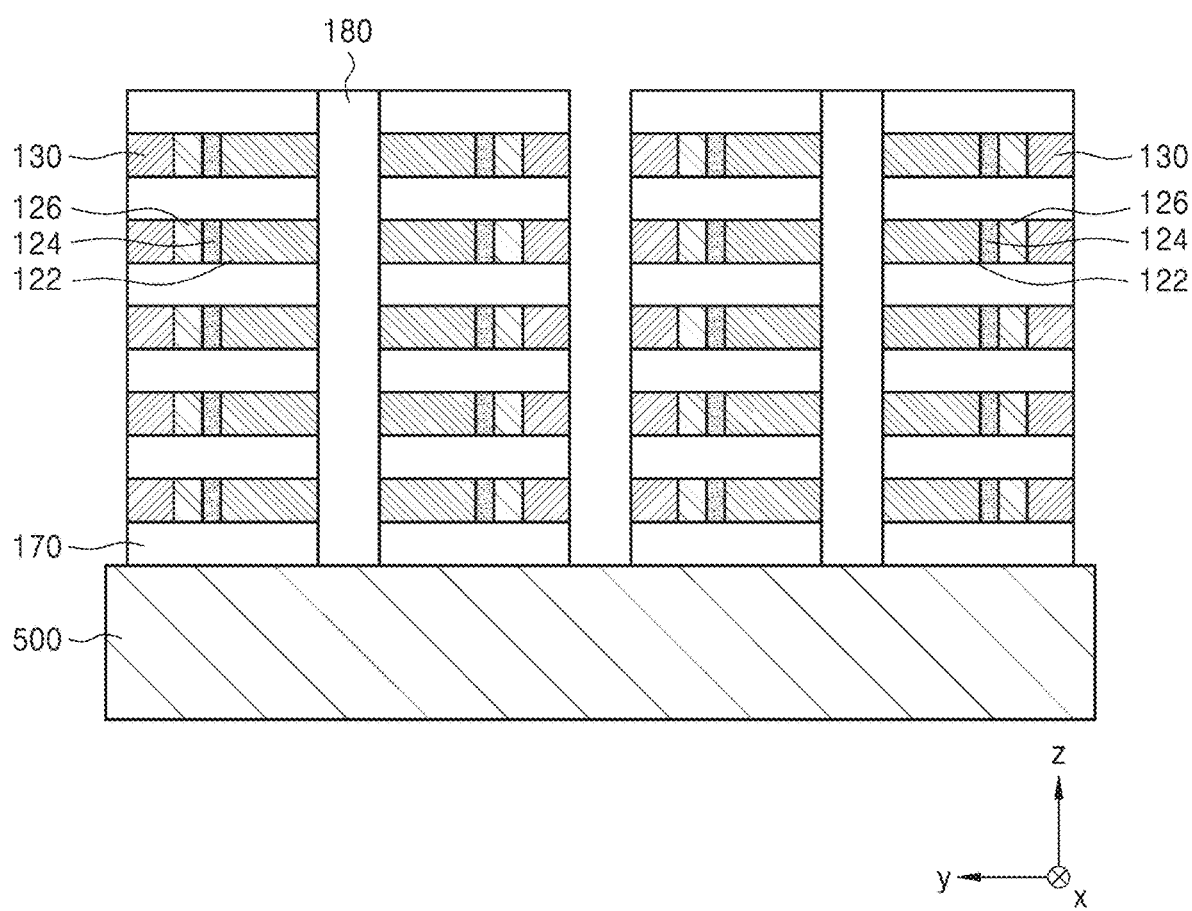

With reference to FIG. 11, the cell blocks 115 may be separated by etching the plurality of insulation layers 170 and the plurality of channel layers 122 in the z-axis direction perpendicular to the substrate 500, and then the second insulation layer 180 may be stacked between the separation space. In this manner, a plurality of channel structures 120 of FIG. 1 may be formed, and the plurality of channel structures 120 may be arranged on the substrate 500 in the form of a three-dimensional array. Here, each channel structure 120 may include the channel layer 122, the gate insulation layer 124, and the ferroelectric layer 126.

Figure 13:
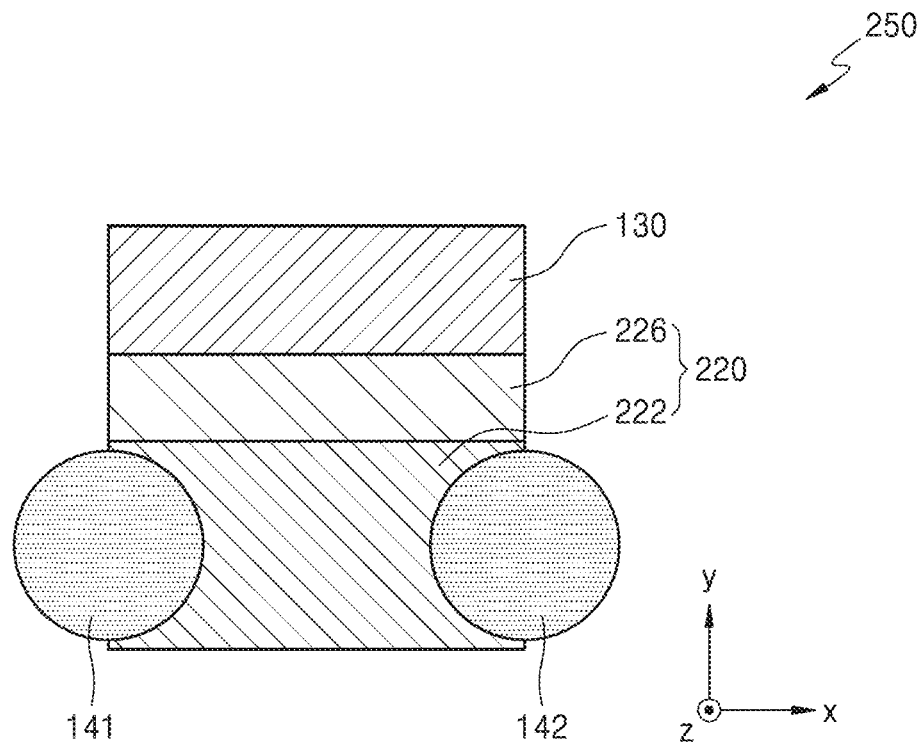
FIG. 13 is a diagram of another field effect transistor which may be employed in a semiconductor device according to an example embodiment.
Figure 14:
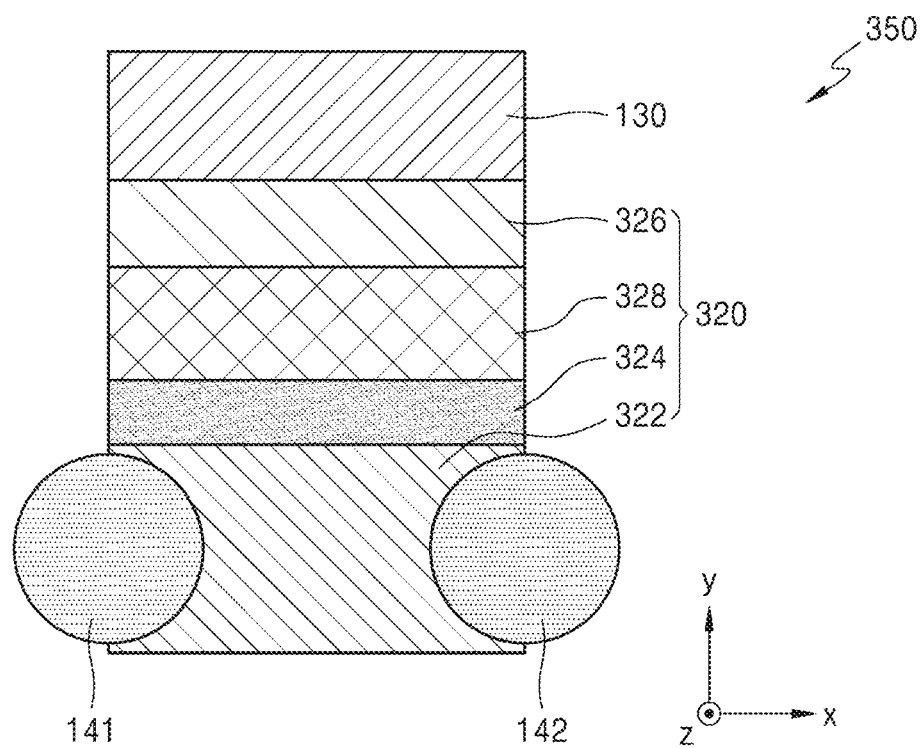
FIG. 14 is a diagram of another field effect transistor which may be employed in a semiconductor device according to an example embodiment.

Each gate electrode 130 may be formed to be connected to the channel structures 120 (specifically, the ferroelectric layers 126) arranged in the x-axis direction parallel to the substrate 500. Meanwhile, as illustrated in FIG. 13, a channel structure 220 may include a channel layer 222 and a ferroelectric layer 226, or as illustrated in FIG. 14, a channel structure 320 may include a channel layer 322, a gate insulation layer 324, a floating gate electrode 328, and a ferroelectric layer 326.

Figure 12:
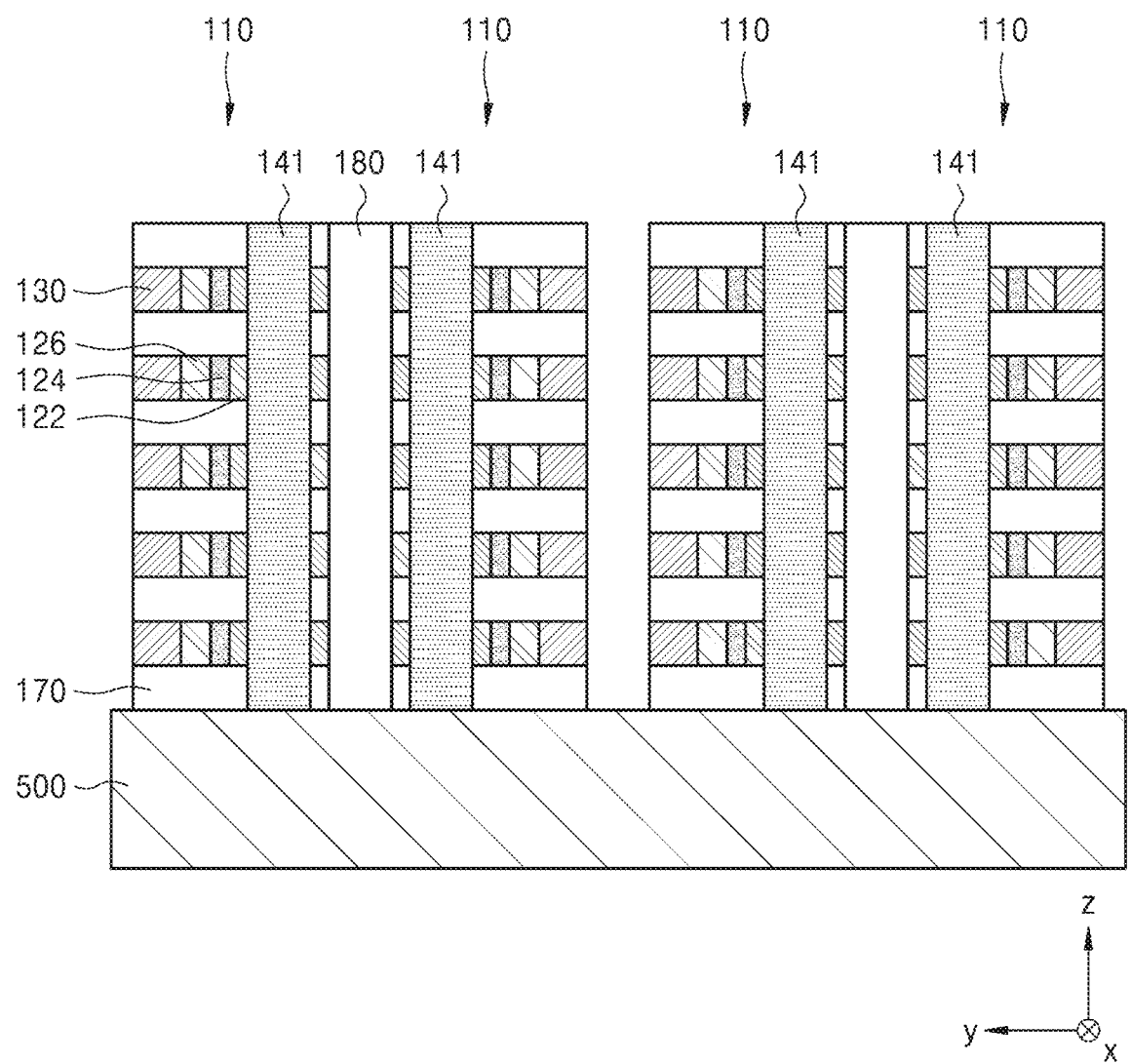

With reference to FIG. 12, by etching the plurality of insulation layers 170 and the plurality of channel layers 122 in the z-axis direction perpendicular to the substrate 500 to form a plurality of through holes (not shown), and then stacking electrically conductive materials inside the through holes, the plurality of source electrodes 141 and drain electrodes 142 of FIG. 1 may be stacked. Here, each source electrode 141 and drain electrode 142 may be formed to be connected to the channel structures 120 (specifically, the channel layers 122) perpendicular to the substrate 500.

As illustrated in FIG. 12, a plurality of cell plates 110 may be arranged on the substrate 500 in the z-axis direction perpendicular to the substrate 500 (e.g., a direction parallel to the xz plane). Here, each cell plate 110 may include a plurality of channel structures 120, a plurality of gate electrodes 130, and a plurality of source electrodes 141 and drain electrodes 142. Further, each channel structure 120 may include the channel layer 122, the gate insulation layer 124, and the ferroelectric layer 126. Each gate electrode 130 may be connected to contact the channel structures 120 arranged in the x-axis direction parallel to the substrate 500, and each source electrode 141 and drain electrode 142 may be connected to contact the channel structures 120 arranged in the z-axis direction perpendicular to the substrate 500.

Hereinafter, other example field effect transistors that may be employed in the semiconductor device 100 aforementioned above will be described.

FIG. 13 is a diagram of another field effect transistor which may be employed in a semiconductor device according to an example embodiment. A ferroelectric field effect transistor 250 illustrated in FIG. 13 may have a metal-ferroelectric-semiconductor (MFS) structure.

With reference to FIG. 13, the ferroelectric field effect transistor 250 may include a channel structure 220, the gate electrode 130, the source electrodes 141 and the drain electrodes 142. Here, the channel structure 220 may include a channel layer 222, and a ferroelectric layer 226.

The channel layer 222 may include, for example, Si, Ge, SiGe, or group III-V semiconductors, etc. Further, the channel layer 222 may include, for example, an oxide semiconductor, a nitride semiconductor, an oxynitride semiconductor, a two-dimensional (2D) material, quantum dots, an organic semiconductor, etc.

The ferroelectric layer 226 may be provided on the channel layer 222. The ferroelectric layer 226 may include, for example, perovskite or fluorite-based materials. Perovskite may include, for example, PZT, $BaTiO_3$, $PbTiO_3$, etc. Fluorite-based materials may include, for example, an oxide of at least one selected from Hf, Si, Al, Zr, Y, La, Gd, and Sr.

The gate electrode 130 may be provided on the ferroelectric layer 226. The source electrode 141 and the drain electrode 142 may be provided on each side of the channel layer 222.

When the ferroelectric field effect transistor 250 is employed in the semiconductor device 100 illustrated in FIG. 1, the gate electrode 130 may be arranged to extend in a direction parallel to the substrate 500 (e.g., the x-axis direction in FIG. 1). The gate electrode 130 may be connected to the ferroelectric layers 226 arranged in the direction parallel to the substrate 500 (e.g., the x-axis direction).

The source electrodes 141 and the drain electrodes 142 may be provided to extend in a direction perpendicular to the substrate 500 (e.g., the z-axis direction in FIG. 1). The source electrodes 141 and the drain electrodes 142 may be connected to the channel layers 222 arranged in the direction perpendicular to the substrate 500 (e.g., the z-axis direction).

FIG. 14 is a diagram of another field effect transistor which may be employed in a semiconductor device according to an example embodiment. A ferroelectric field effect transistor 350 illustrated in FIG. 14 may have a metal-ferroelectric-metal-insulator-semiconductor (MFMIS) structure.

With reference to FIG. 14, the ferroelectric field effect transistor 350 may include the channel structure 320, the gate electrode 130, the source electrodes 141 and the drain electrodes 142. Here, the channel structure 320 may include the channel layer 322, the gate insulation layer 324, the floating gate electrode 328, and the ferroelectric layer 326.

The channel layer 322 may include, for example, Si, Ge, SiGe, or group III-V semiconductors, etc. Further, the channel layer 322 may include, for example, an oxide semiconductor, a nitride semiconductor, an oxynitride semiconductor, a two-dimensional (2D) material, quantum dots, an organic semiconductor, etc.

The gate insulation layer 324 may be provided on the channel layer 322. The gate insulation layer 324 may include paraelectric materials or high-k materials. The floating gate electrode 328 may be provided on the gate insulation layer 324. The floating gate electrode 328 may store charges and include electrically conductive materials. The ferroelectric layer 326 may be provided on the floating gate electrode 328. The ferroelectric layer 326 may include, for example, perovskite or fluorite-based materials. The gate electrode 130 may be provided on the ferroelectric layer 326. The source electrode 141 and the drain electrode 142 may be provided on each side of the channel layer 322.

When the ferroelectric field effect transistor 350 is employed in the semiconductor device 100 illustrated in FIG. 1, the gate electrode 130 may be arranged to extend in a direction parallel to the substrate 500 (e.g., the x-axis direction in FIG. 1). The gate electrode 130 may be connected to the ferroelectric layers 326 arranged in the direction parallel to the substrate 500 (e.g., the x-axis direction).

The source electrodes 141 and the drain electrodes 142 may be provided to extend in a direction perpendicular to the substrate 500 (e.g., the z-axis direction in FIG. 1). The source electrodes 141 and the drain electrodes 142 may be connected to the channel layers 322 arranged in the direction perpendicular to the substrate 500 (e.g., the z-axis direction).

The semiconductor device 100 having a three-dimensional stacked structure described above may be applied to a memory device, in particular, to a non-volatile memory device in various electronic devices, and further to, for example, a logical element. The semiconductor device 100 according to an example embodiment may be driven with a low power, and thus may meet the demand for miniaturization and integration of electronic devices. For example, the semiconductor device 100 may be used for arithmetic operations, execution of programs, temporary data maintenance, etc. in electronic devices such as a mobile device, a computer, a notebook, a sensor, a network device, a neuromorphic device, etc.

Figure 15:
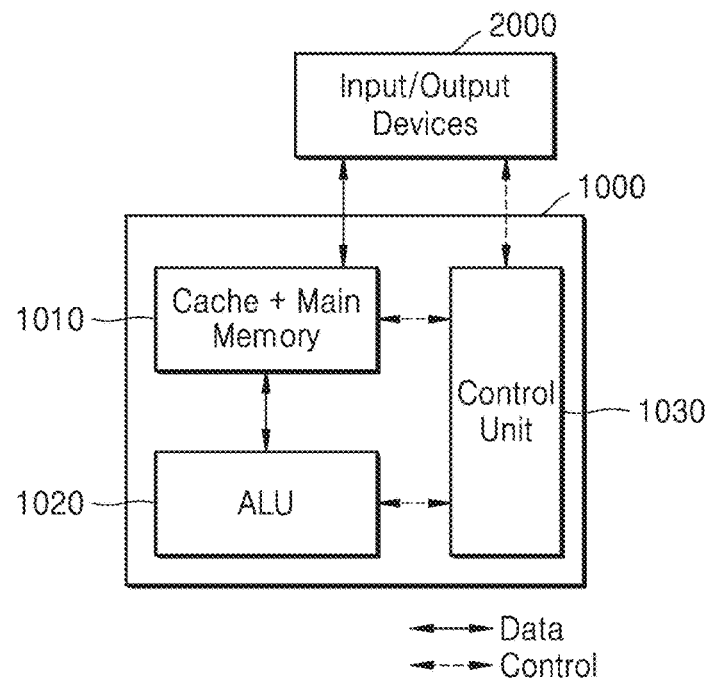
FIGS. 15 and 16 are conceptual diagrams schematically showing an electronic device architecture which may be applied to an electronic device according to an example embodiment.
Figure 16:
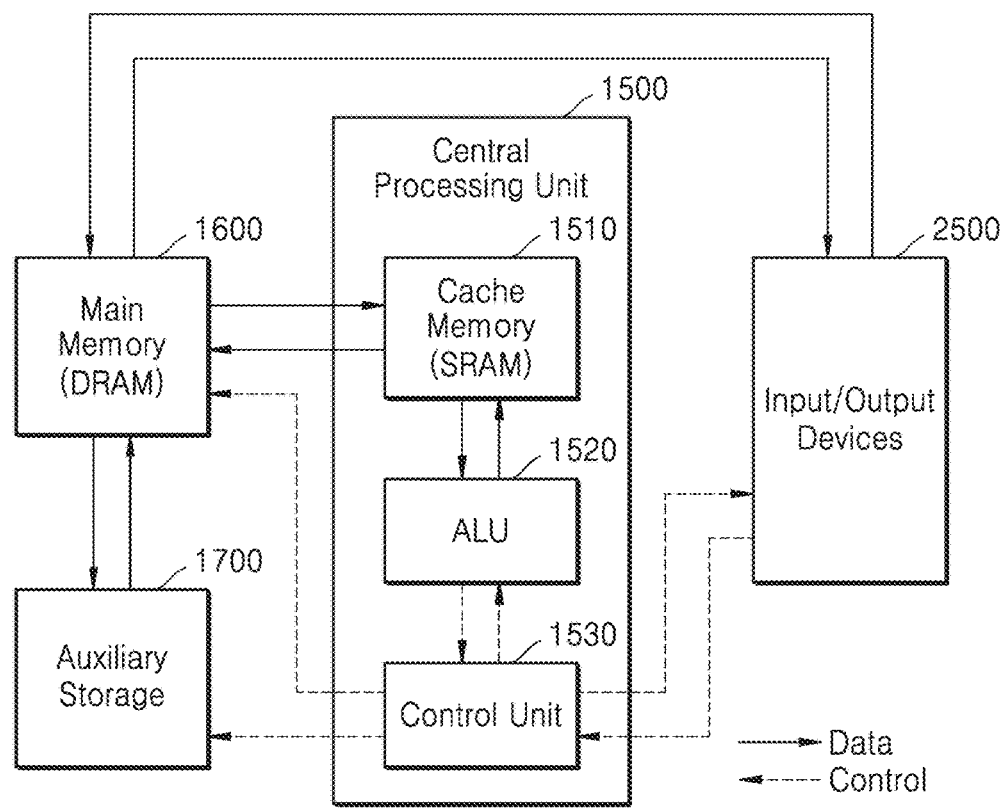

FIGS. 15 and 16 are conceptual diagrams schematically showing an electronic device architecture which may be applied to an electronic device according to an embodiment.

With reference to FIG. 15, an electronic device architecture 1000 may include a memory unit 1010, an arithmetic logic unit (ALU) 1020, a control unit 1030. The memory unit 1010, the ALU 1020, and the control unit 1030 may be electrically connected. For example, the electronic device architecture 1000 may be implemented as a single chip including the memory unit 1010, the ALU 1020, and the control unit 1030. Specifically, the memory unit 1010, the ALU 1020, and the control unit 1030 may be interconnected by a metal line in an on-chip, and directly communicate with each other. The memory unit 1010, the ALU 1020, and the control unit 1030 may be integrated on one substrate in a monolithic manner and constitute a chip. Input/output devices 2000 may be connected to the electronic device architecture 1000.

The memory unit 1010, the ALU 1020, and the control unit 1030 may each include independently the semiconductor device described above. The memory unit 1010 may include both of a main memory and a cache memory. Such electronic device architecture 1000 may be an on-chip memory processing unit.

With reference to FIG. 16, a cache memory 1510, an ALU 1520, and a control unit 1530 may constitute a central processing unit (CPU) 1500. The cache memory 1510 may include static random access memory (SRAM), and may include the semiconductor device described above. A main memory 1600 and an auxiliary storage 1700 may be provided separately from the CPU 1500. The main memory 1600 may include dynamic random access memory (DRAM), and may include the semiconductor device described above.

In some cases, the electronic device architecture may be implemented in a form in which computing unit elements and memory unit elements are adjacent to each other on a single chip without separating sub-units.

According to the foregoing example embodiment, as the semiconductor device includes a plurality of FeFETs stacked in the form of a three-dimensional array, a memory device having a one-transistor (1T) structure with a high memory density may be implemented. The semiconductor device 100 may be used, for example, as a memory device, more specifically, a non-volatile memory device.

Figure 17:
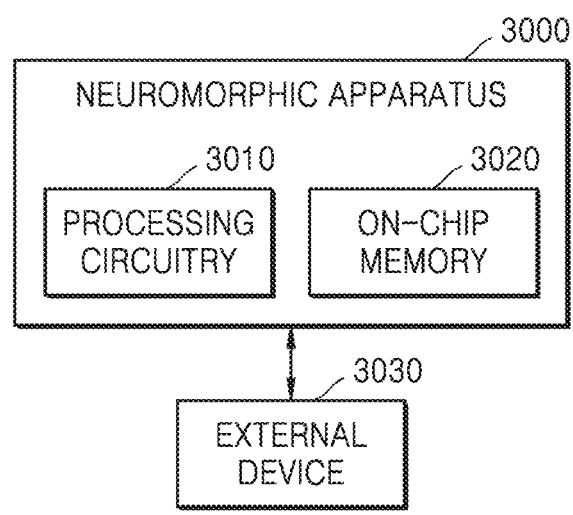
FIG. 17 is a schematic view of a neuromorphic device including a memory according to an example embodiment.

FIG. 17 is a schematic view of a neuromorphic device including a memory according to an embodiment. Referring to FIG. 17, the neuromorphic device 3000 may include processing circuitry 3010 and/or a memory 3020. The memory 3020 of the neuromorphic device 3000 may include the semiconductor device 100 and/or FeFETs 150, 250, and 350 according to one of the above-described embodiments.

In some example embodiments, processing circuitry 3010 may be configured to control functions for driving the neuromorphic apparatus 3000. For example, the processing circuitry 3010 may be configured to control the neuromorphic apparatus 3000 by executing programs stored in the memory 3020 of the neuromorphic apparatus 3000. In some example embodiments, the processing circuitry 3010 may be configured to read/write various data from/in the external device 3030 and/or execute the neuromorphic apparatus 3000 by using the read/written data. In some embodiments, the external device 3030 may include an external memory and/or sensor array with an image sensor (e.g., CMOS image sensor circuit).

In some embodiments, the neuromorphic apparatus may be applied in a machine learning system. The machine learning system may utilize a variety of artificial neural network organizational and processing models, such as convolutional neural networks (CNN), deconvolutional neural networks, recurrent neural networks (RNN) optionally including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM).

Alternatively or additionally, such machine learning systems may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests. Such machine learning models may also be used to provide various services and/or applications, e.g., an image classify service, a user authentication service based on bio-information or biometric data, an advanced driver assistance system (ADAS) service, a voice assistant service, an automatic speech recognition (ASR) service, or the like, may be performed, executed or processed by electronic devices.

Although some embodiments have been described, the embodiments are provided only as an example, and thus various modifications may be made by a person skilled in the art.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A semiconductor device comprising:
a substrate;
a plurality of channel structures on the substrate and arranged in a three-dimensional array including channel structures arranged in a direction parallel to the substrate and channel structures arranged in a direction perpendicular to the substrate, and the plurality of channel structures each including a channel layer and a ferroelectric layer on the channel layer;
a plurality of gate electrodes extending in the direction parallel to the substrate and connected to the channel structures arranged in the direction parallel to the substrate; and
a plurality of source electrodes and drain electrodes extending in the direction perpendicular to the substrate and connected to the channel structures arranged in the direction perpendicular to the substrate,
wherein the ferroelectric layer includes fluorite-based materials or perovskite.

2. The semiconductor device of claim 1, wherein
the ferroelectric layer and the channel layer in each corresponding channel structure among the plurality of channel structures provides ferroelectric layers arranged in the direction parallel to the substrate and channel layers arranged in the direction perpendicular to the substrate,
the gate electrodes are connected to the ferroelectric layers arranged in the direction parallel to the substrate, and
the source and drain electrodes are connected to the channel layers arranged in the direction perpendicular to the substrate.

3. The semiconductor device of claim 1,
wherein the ferroelectric layer includes an oxide of at least one of Hf and Zr.

4. The semiconductor device of claim 3,
wherein the ferroelectric layer further includes a dopant of at least one of Si, Al, La, Y, Sr, and Gd.

5. The semiconductor device of claim 1, wherein the plurality of channel structures each include a gate insulation layer between the channel layer and the ferroelectric layer.

6. The semiconductor device of claim 5, wherein the plurality of channel structures each include a floating electrode between the ferroelectric layer and the gate insulation layer.

7. The semiconductor device of claim 1,
wherein the semiconductor device has properties of a non-volatile memory.

8. A method of manufacturing a semiconductor device, the method comprising:
alternately stacking a plurality of insulation layers and a plurality of channel layers on a substrate;
forming a plurality of cell blocks by etching the plurality of insulation layers and the plurality of channel layers in a direction perpendicular to the substrate;
forming a plurality of channel recesses by selectively etching the plurality of channel layers between the plurality of insulation layers;

forming a ferroelectric layer and a gate electrode on each channel layer in each channel recess among the plurality of channel layers and the plurality of channel recesses;

separating each cell block, among the plurality of cell blocks, by etching the plurality of insulation layers and the plurality of channel layers in the direction perpendicular to the substrate; and forming a source electrode and a drain electrode on the substrate, the source electrode and the drain electrode extending in the direction perpendicular to the substrate, wherein the ferroelectric layer includes fluorite-based materials or perovskite.

9. The method of claim 8, wherein the forming the gate electrode comprises:

forming electrically conductive materials in spaces between the plurality of cell blocks; and etching the electrically conductive materials so a remaining portion of the electrically conductive materials remains only in the plurality of channel recesses.

10. The method of claim 9, the forming the ferroelectric layer forms a plurality of ferroelectric layers arranged in a direction parallel to the substrate, and the gate electrode is formed to be connected to the plurality of ferroelectric layers arranged in the direction parallel to the substrate.

11. The method of claim 8, wherein the forming of the source electrode and the drain electrode comprises:

forming a through hole in the plurality of insulation layers and the plurality of channel layers by etching the plurality of insulation layers and the plurality of channel layers in the direction perpendicular to the substrate; and filling the through hole with electrically conductive materials.

12. The method of claim 11, wherein the source electrode and the drain electrode are formed to be connected to the plurality of channel layers arranged in the direction perpendicular to the substrate.

13. The method of claim 8, wherein the ferroelectric layer includes an oxide of at least one of Hf and Zr.

14. The method of claim 13, wherein the ferroelectric layer further includes a dopant of at least one of Si, Al, La, Y, Sr, and Gd.

15. The method of claim 8, further comprising:

forming a gate insulation layer between the channel layer and the ferroelectric layer.

16. The method of claim 15, further comprising:

forming a floating electrode between the ferroelectric layer and the gate insulation layer.

17. A semiconductor device comprising:

a substrate; and a cell plate on an upper surface of the substrate, the cell plate including a plurality of insulation layers and a plurality of cell layers alternately stacked on the upper surface of the substrate, each of the plurality of cell layers including a gate electrode extending in a first direction and a plurality of channel structures, the plurality of channel structures being spaced apart from each other in the first direction and connected to the gate electrode, each of the plurality of channel structures including a channel layer and a ferroelectric layer between the gate electrode and the channel layer, the cell plate including a plurality of source electrodes and a plurality of drain electrodes on the upper surface of the substrate and alternately arranged and spaced apart from each other in the first direction, the plurality of source electrodes and the plurality of drain electrodes extending in a direction perpendicular to the upper surface of the substrate through the plurality of insulation layers and the plurality of cell layers alternately stacked, wherein each channel layer, in the plurality of channel structures of each of the plurality of cell layers, has a corresponding one of the plurality of source electrodes and a corresponding one of the plurality of drain electrodes extending therethrough, wherein the ferroelectric layer includes fluorite-based materials or perovskite.

18. The semiconductor device of claim 17, wherein the ferroelectric layer includes an oxide of at least one of Hf and Zr.

19. The semiconductor device of claim 17, further comprising:

an insulating layer on the substrate, wherein the cell plate is a first cell plate among a plurality of cell plates on the substrate, the plurality of cell plates include a second cell plate, the insulating layer is between the first cell plate and the second cell plate, and the insulating layer extends in the direction perpendicular to the upper surface of the substrate.

20. The semiconductor device of claim 17, wherein each of the plurality of channel structures includes a gate insulation layer between the ferroelectric layer and the channel layer.

21. The semiconductor device of claim 20, wherein each of the plurality of channel structures includes a floating electrode between the ferroelectric layer and the gate insulation layer.

* * * * *